US009121772B2

(12) United States Patent
Tanaka

(10) Patent No.: US 9,121,772 B2
(45) Date of Patent: Sep. 1, 2015

(54) SEMICONDUCTOR ELEMENT TEMPERATURE DETECTING SYSTEM AND SEMICONDUCTOR MODULE AND SEMICONDUCTOR MODULE SYSTEM

(71) Applicant: Teruaki Tanaka, Chiyoda-ku (JP)

(72) Inventor: Teruaki Tanaka, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/359,156

(22) PCT Filed: Jan. 25, 2013

(86) PCT No.: PCT/JP2013/051610
§ 371 (c)(1),
(2) Date: May 19, 2014

(87) PCT Pub. No.: WO2013/111863
PCT Pub. Date: Aug. 1, 2013

(65) Prior Publication Data
US 2014/0306749 A1    Oct. 16, 2014

(30) Foreign Application Priority Data
Jan. 25, 2012    (JP) .................. 2012-013043

(51) Int. Cl.
*G01K 13/00* (2006.01)
*H03K 17/14* (2006.01)
*G01K 7/01* (2006.01)
*H03K 17/08* (2006.01)

(52) U.S. Cl.
CPC .... *G01K 13/00* (2013.01); *G01K 7/01* (2013.01); *H03K 17/14* (2013.01); *G01K 2219/00* (2013.01); *H01L 2924/0002* (2013.01); *H03K 2017/0806* (2013.01)

(58) Field of Classification Search
CPC ............................. G01K 13/00; H03K 17/14
USPC ......................................................... 327/378
See application file for complete search history.

(56) References Cited

U.S. PATENT DOCUMENTS

2010/0110815 A1*    5/2010    Lee et al. .................. 365/211

FOREIGN PATENT DOCUMENTS

JP          9 89588         4/1997
JP       2004 87871         3/2004
(Continued)

OTHER PUBLICATIONS

"Power Electronics Handbook—Gate Driving Circuit" Ohmsha, pp. 460-462, ISBN978-4-274-4-20790-7, Book 5, chapter 7, Jul. 20, 2010.
"Power Electronics Handbook—Control Circuit" Ohmsha, pp. 472-479, Book 5, Chapter 10, Jul. 20, 2010.
IPM L1/S1-series Application Note: Mitsubishi Electric., pp. 1-46, Sep. 2008 (with English translation).
(Continued)

*Primary Examiner* — Sibin Chen
*Assistant Examiner* — Metasebia Retebo
(74) *Attorney, Agent, or Firm* — Oblon, McClelland, Maier & Neustadt, L.L.P.

(57) ABSTRACT

A temperature data coding unit 100 increases the data resolution in a high temperature range and reduces the data resolution in a low temperature range, and makes the data length of the temperature data a fixed length. When carrying out numerical estimation of the fixed length code value in terms of a 2's complement numerical code value, the temperature data coding unit 100 generates coded data that increases with an increase of the pre-coded temperature data in terms of the 2's complement numerical code value.

11 Claims, 8 Drawing Sheets

(56) References Cited

FOREIGN PATENT DOCUMENTS

| | | |
|---|---|---|
| JP | 2008 51775 | 3/2008 |
| JP | 2011 172336 | 9/2011 |

OTHER PUBLICATIONS

International Search Report Issued May 7, 2013 in PCT/JP13/051610 Filed Jan. 25, 2013.

\* cited by examiner

SEMICONDUCTOR ELEMENT TEMPERATURE DETECTING SYSTEM AND SEMICONDUCTOR MODULE AND SEMICONDUCTOR MODULE SYSTEM

TECHNICAL FIELD

The present invention relates to a semiconductor element temperature detecting system that mainly detects the temperature of a power device (power semiconductor element) and to a semiconductor module and semiconductor module system that perform the temperature control of a semiconductor element using the temperature detecting system.

BACKGROUND ART

As for a power semiconductor element, to protect it from an overheat breakdown, measures are taken for detecting the temperature of the semiconductor element and controlling the semiconductor gate in response to the detection (see Patent Document 1, for example). In addition, the temperature detected is transferred to an external apparatus to be displayed thereon via an interface with the outside. Since a power semiconductor element operates under a high voltage/high current environment, the communication with the outside usually employs a contactless means. Although the Patent Document 1 shows an example of contactless transmission using an antenna, a contactless transmission means such as a photocoupler is generally used. In addition, if the temperature detected is high, measures are generally taken to stop the gate driving of the semiconductor element to prevent a thermal breakdown of the semiconductor element. The Patent Document 1 also shows an example that makes a direct decision of a temperature detection result, and breaks the gate driving signal.

PRIOR ART DOCUMENT

Patent Document

Patent Document 1: Japanese Patent Laid-Open No. 2004-87871.

DISCLOSURE OF THE INVENTION

Problems to be Solved by the Invention

To detect the temperature of a power semiconductor element at high accuracy, it is necessary to correct variation of a temperature sensor. To perform highly reliable correction by avoiding the effect of an electromagnetic environment in which the power semiconductor element operates, it is necessary to perform the correction at the outside isolated from the power semiconductor element. To achieve this, it is necessary for temperature data to be communicated across an insulating material and for its amount to be reduced to carry out low cost, highly reliable, high-speed data communication. This is because an insulating material capable of high-speed communication is expensive, and the reliability of the insulating material is not high. However, the method of simply reducing the amount of data will deteriorate the accuracy of the data. Thus, the conventional apparatus does not consider reducing the amount of data while maintaining the accuracy required for the temperature data.

The present invention is implemented to solve the foregoing problems. Therefore it is an object of the present invention to provide a semiconductor element temperature detecting system and a semiconductor element module and a semiconductor module system capable of reducing the cost and maintaining the high reliability.

Means for Solving the Problems

A semiconductor element temperature detecting system in accordance with the present invention comprises: a digital temperature data measuring unit that detects temperature of a semiconductor element as digital temperature data; and a temperature data coding unit that codes the digital temperature data to coded data with a prescribed length, which coded data has lower data resolution in a low temperature range domain than in a high temperature range domain, and increases with an increase of the digital temperature data when estimating the digital temperature data as 2's complement numbers.

In addition, a semiconductor module in accordance with the present invention comprises: a semiconductor element; a digital temperature data measuring unit that detects temperature of the semiconductor element as digital temperature data; and a temperature data coding unit including: a pre-code converting unit that determines a plurality of temperature range domains in accordance with prescribed lower-order bits of the digital temperature data, and generates a pre-code from higher-order bits of the digital temperature data other than the prescribed lower-order bits; a significant data acquiring unit that obtains significant data corresponding to the temperature range domain from the prescribed lower-order bits of the digital temperature data; and a connecting unit that generates coded data by combining the pre-code with the significant data.

Furthermore, a semiconductor module system in accordance with the present invention comprises: a semiconductor element; a controller that outputs an instruction signal for controlling a gate of the semiconductor element; a digital temperature data measuring unit that detects temperature of the semiconductor element as digital temperature data; a temperature data coding unit including a pre-code converting unit that determines a plurality of temperature range domains in accordance with prescribed lower-order bits of the digital temperature data, and generates a pre-code from higher-order bits of the digital temperature data other than the prescribed lower-order bits, a significant data acquiring unit that obtains significant data corresponding to the temperature range domain from the prescribed lower-order bits of the digital temperature data, and a connecting unit that generates coded data by combining the pre-code with the significant data; a control unit that decides validity of the instruction signal of the controller in accordance with the digital temperature data and generates a control signal; and a driving signal generating unit that generates a driving signal for driving the gate of the semiconductor element in response to the control signal.

Advantages of the Invention

According to the present invention, it can transmit the temperature data at high-speed, and can reduce the cost and maintain the high reliability.

BEST MODE FOR CARRYING OUT THE INVENTION

The best mode for carrying out the invention will now be described with reference to the accompanying drawings to explain the present invention in more detail.

Embodiment 1

Figure 1:
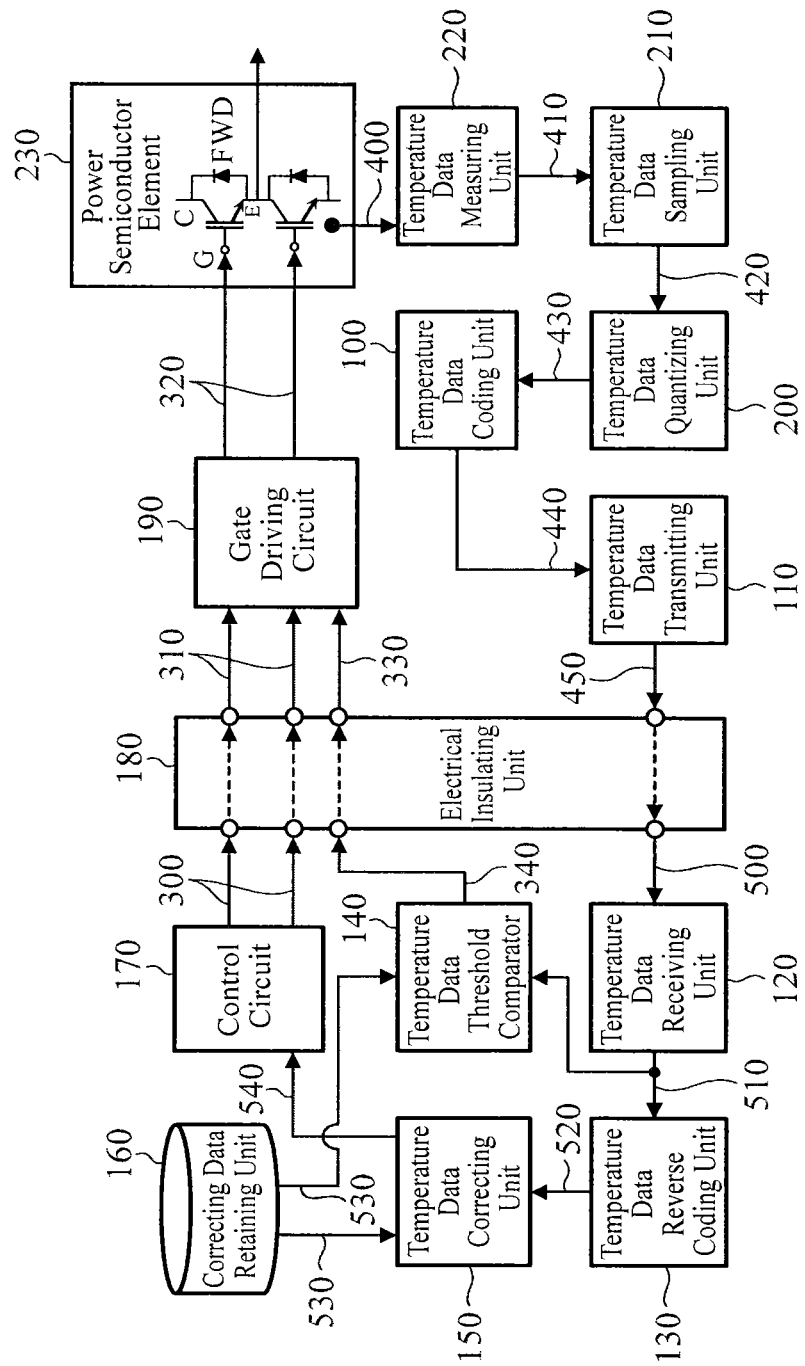
FIG. 1 is a block diagram showing a configuration of a semiconductor element temperature control system of an embodiment 1 in accordance with the present invention.

FIG. 1 is a block diagram showing a configuration of a semiconductor element temperature control system of an embodiment 1 in accordance with the present invention.

The semiconductor element temperature control system shown in FIG. 1 comprises a temperature data coding unit 100, a temperature data transmitting unit 110, a temperature data receiving unit 120, a temperature data reverse coding unit 130, a temperature data threshold comparator 140, a temperature data correcting unit 150, a correcting data retaining unit 160, a control circuit 170, an electrical insulating unit 180, a gate driving circuit 190, a temperature data quantizing unit 200, a temperature data sampling unit 210, a temperature data measuring unit 220, and a power semiconductor element 230.

The temperature data coding unit 100 is a coding unit that codes temperature data (post-quantization temperature data 430) quantized by the temperature data quantizing unit 200, and its details will be described later. The temperature data transmitting unit 110 is a transmitting unit that transmits coded temperature data (post-coding temperature data 440) coded by the temperature data coding unit 100 to an electri-cally insulated outside from the power semiconductor element 230. The temperature data receiving unit 120 is a receiving unit that receives the coded temperature data (post-coding temperature transmission data 450) transmitted from the temperature data transmitting unit 110 via the electrical insulating unit 180 as insulating unit passed temperature data 500. The temperature data reverse coding unit 130 is an arithmetic unit that decodes the coded temperature data (post-coding temperature received data 510) received by the temperature data receiving unit 120, and outputs as reverse coded temperature data 520.

The temperature data threshold comparator 140 is an arithmetic unit that compares the post-coding temperature received data 510 received by the temperature data receiving unit 120 with the correcting data (temperature correcting data 530) of the temperature data stored in the correcting data retaining unit 160, and outputs the comparison result as an overheat protection instruction signal 340. The temperature data correcting unit 150 is an arithmetic unit that corrects the temperature data (reverse coded temperature data 520) decoded by the temperature data reverse coding unit 130 with the correcting data (temperature correcting data 530) stored in the correcting data retaining unit 160, and outputs the post-correction data as post-correction temperature data 540. The correcting data retaining unit 160 is a storage that holds the correcting data of the temperature data. The control circuit 170 is a control circuit that uses the post-correction temperature data 540 as one of the inputs, calculates the gate driving data required, and outputs it as a power device gate instruction signal 300. The electrical insulating unit 180, which is composed of a photocoupler, for example, is a unit that electrically insulates the high voltage power device section from a low voltage section that generates the control data.

The gate driving circuit 190 is a control unit that receives as its input a power device gate control signal 310, a signal corresponding to a power device gate instruction signal 300 output from the control circuit 170 and received via the electrical insulating unit 180, and receives an overheat protection control signal 330, a signal corresponding to an overheat protection instruction signal 340 output from the temperature data threshold comparator 140 and received via the electrical insulating unit 180, and that outputs a power device gate driving signal 320 for controlling the gate driving current of the power semiconductor element 230 in response to the signals.

The temperature data quantizing unit 200 is an arithmetic unit that quantizes the temperature data output from the temperature data sampling unit 210 (post-sampling temperature data 420), and sends to the temperature data coding unit 100 as the post-quantization temperature data 430. The temperature data sampling unit 210 is a processing unit that samples the temperature data (power device temperature detection data 410), and sends to the temperature data quantizing unit 200 as the post-sampling temperature data 420. The temperature data measuring unit 220 is a sensing unit using a thermal diode or the like that measures the temperature of the heat generated from the power semiconductor element 230 (power device production heat 400), and sends to the temperature data sampling unit 210 as the power device temperature detection data 410. Incidentally, the temperature data quantizing unit 200 to the temperature data measuring unit 220 constitute a digital temperature data measuring unit that detects the temperature of the semiconductor element, which is a target to be measured, as the digital temperature data. As the power semiconductor element (power device) 230, which is a semiconductor device for carrying out efficient power control, a device is generally used such as a power MOSFET (Metal-Oxide-Semiconductor Field-Effect Transistor) and an IGBT (Insulated Gate Bipolar Transistor).

Next, the configuration and its operation will be described further.

An example using IGBTs as the power semiconductor element 230 will be described. An IGBT has a withstanding voltage of several hundred to several thousand volts, and can pass a heavy current by the ON/OFF switching control of the gate (G) voltage. To control the current direction, a bridge circuit comprising a plurality of elements is often formed. The power semiconductor element 230 in FIG. 1 has two gate driving signals (power device gate driving signal 320) input thereto to drive the upper side element and the lower side element in FIG. 1.

The switching of the gate signal of the IGBT is carried out by the control circuit 170. The control circuit 170 is a functional unit that is generally implemented by an IC such as a microcomputer or gate array and operates at a low voltage of 5 V or 3.3 V. In contrast, the power device section operates at a high voltage of several hundred to several thousand volts. Thus, the gate switching signal (power device gate instruction signal 300) output from the control circuit 170 is supplied to the gate driving circuit 190 via the electrical insulating unit 180 so that the gate driving circuit 190 outputs the power device gate driving signal 320. Here, the power device gate instruction signal 300, power device gate control signal 310, and power device gate driving signal 320 are connected as signals, and transfer the same gate switching signal. Incidentally, as for such driving control of the power device, since it is publicly known as described in "Power Electronics Handbook" ((Ohmsha, Ltd. ISBN978-4-274-20790-7), "Book 5, Chapter 7, Gate Driving Circuit" and "Book 5, Chapter 10 Control Circuit", its detailed description will be omitted.

In the power semiconductor element 230 such as the IGBT, various losses occur such as the stationary loss and switching loss of the transistors themselves, and the stationary loss and switching loss of the antiparallel diodes (FWD: Free Wheeling Diodes), and they produce heat, thereby resulting in an increase in the temperature of the semiconductor element. Generally, although appropriate cooling is made by appropriate thermal design at the apparatus side using the power device, there is a possibility that a heating value increases owing to an environmental factor and a control signal factor, which will lead to a thermal breakdown of the semiconductor element. To prevent this, the temperature of the power device is detected with the sensor (in FIG. 1, the power device production heat 400 brought about by the power semiconductor element 230 is detected with the temperature data measuring unit 220), and is compared with the threshold temperature. If the temperature is not less than the threshold, the driving circuit stops the driving of the power device in response to the overheat protection instruction so as to prevent the thermal breakdown.

Figure 2:
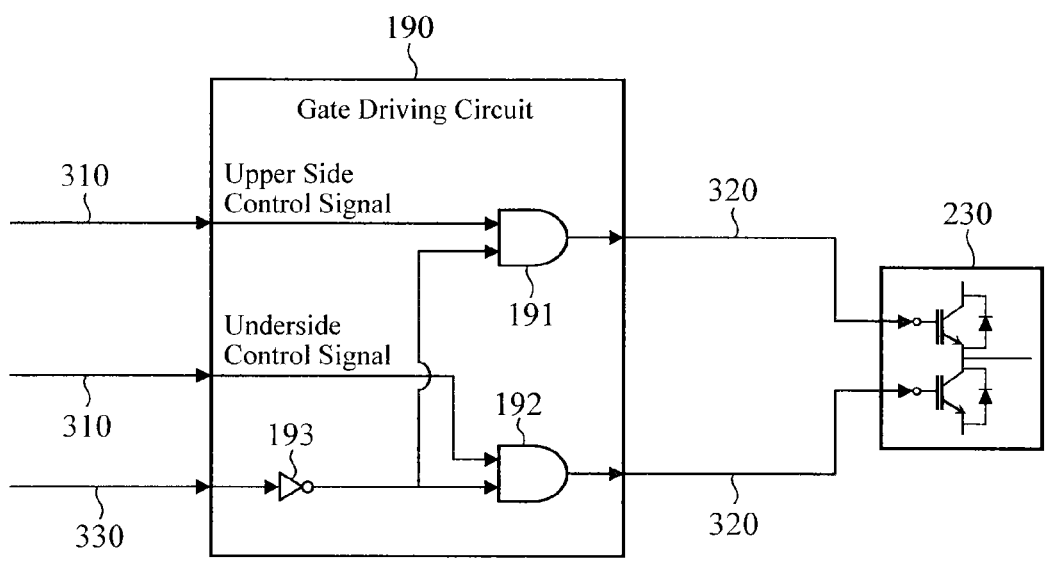
FIG. 2 is a circuit diagram showing a configuration for an overheat protection function of a gate driving circuit of the semiconductor element temperature control system of the embodiment 1 in accordance with the present invention.

FIG. 2 shows a configuration for stopping the driving of the power device. More specifically, the gate driving circuit 190 comprises AND circuits 191 and 192 that receive the upper side control signal and the underside control signal of the power device gate control signal 310 as their first inputs, and an inverter 193 that receives the overheat protection control signal 330 as its input and delivers the inverted output to the second input terminals of the AND circuits 191 and 192, and the outputs of the AND circuits 191 and 192 constitute the power device gate driving signal 320. The example of FIG. 2 is configured in such a manner that when the overheat protection control signal 330 is asserted (value 1), it carries out the control in such a manner as to disable the power device gate control signal 310 and to stop the driving of the power device gate driving signal 320.

The sensor that performs the temperature detection (thermal diode or the like used by the temperature data measuring unit 220) has considerable detection variation depending on each individual sensor, and to increase the detection accuracy, it is necessary to correct the data in accordance with the characteristics of the detection variation of the sensor values detected. The correction is generally made through a value converting operation using correcting data acquired and retained by some method. However, since the periphery of the power device is high in both temperature and voltage as described before, it is difficult to maintain the correcting data at high reliability, and is difficult to carry out the correcting calculation because it requires high technology and high cost.

Thus, although it is conceivable that the low voltage section across the electrical insulating unit 180 retains and calculates the correction, it becomes necessary for the electrical insulating unit 180 to carry out the data communication. Since an electrical insulating material with a high-speed data communication rate is expensive, employing the material offers a problem of increasing the cost. In addition, even if carrying out parallel communication of data through communication that has a plurality of electrical insulating materials with a low-speed data communication rate, since the electrical insulating materials have low reliability as compared with the other components from the first, having a plurality of such materials will result in deteriorating the reliability of the product. In addition, the communication time delay due to passing through the electrical insulating unit 180 (communication delay) can bring about an injury to the power device because of the delay of the threshold temperature comparing processing described before.

Since the communication time is the amount of communication data divided by the communication speed, to reduce the communication time, there is a method of increasing the communication speed or reducing the amount of communication data. Here, assuming that the communication data is the temperature data about the power semiconductor element 230, then a method of reducing the data resolution or narrowing the temperature detection range is conceivable as a method of reducing the amount of data. The method of reducing the data resolution causes a problem of the overheat protection accuracy described before or of the accuracy when the control circuit side switches the processing contents in accordance with the temperature information. On the other hand, the method of narrowing the temperature detection range has a problem in that when limiting the detection range to only a high temperature range, for example, it becomes difficult to visualize the state of the semiconductor element temperature in the normal operation. It goes without saying that when limiting to only a low temperature range, it becomes difficult to carry out the overheat protection described above.

As a method of using the temperature data of the power device detected, although the data with high temperature resolution is necessary in the high temperature range, the low temperature range does not require so high resolution or accuracy. Accordingly, the amount of data can be reduced by handling the values at high temperature as the data with high resolution, and by handling the values at low temperature as the data with low resolution, and if the total detection temperature range can be broadened. Thus, the temperature data coding unit 100 in accordance with the present invention implements the function of coding the temperature data in such a manner. The function will be described below.

The power device temperature detection data 410 detected by the temperature data measuring unit 220 undergoes sampling by the temperature data sampling unit 210 and quantization by the temperature data quantizing unit 200 as is usually implemented by normal AD conversion (analog/digital conversion). The post-quantization temperature data 430 is supplies as an input to the temperature data coding unit 100. The temperature data coding unit 100 fixes the data length of the temperature data while increasing the effective data length by increasing the data resolution in the high temperature range and by reducing the effective data length by reducing the data resolution in the low temperature range. In addition, when making a numerical estimation of a fixed length code value in terms of a 2's complement, the coding carries out the data coding that will increase the 2's complement with an increase in the temperature data.

Figure 3:
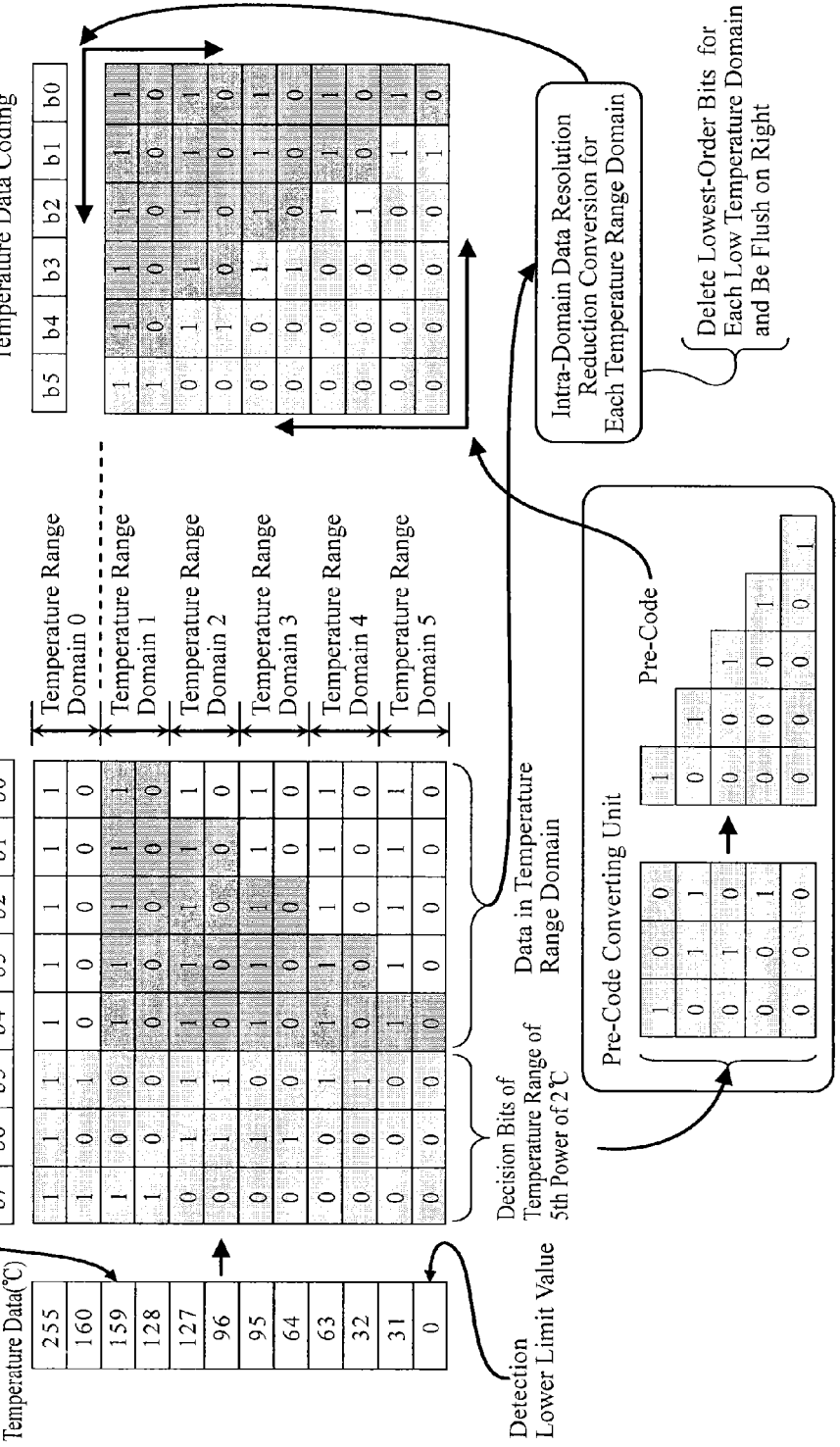
FIG. 3 is a diagram illustrating a coding method of the semiconductor element temperature control system of the embodiment 1 in accordance with the present invention.

FIG. 3 shows a concrete example of the coding. It is assumed here that the post-quantization temperature data 430 is input as 8 bit data which is a numerical code of a 2's complement while maintaining generality as a value from 0 degree C. to 255 degrees C. with resolution 1 degree C. In addition, it is assumed that the upper limit value of the temperature detection determined from common physical properties of a semiconductor is given as 159 degrees C. (since the temperature difference not less than 159 degrees C. is insignificant information, it is enough to know that the temperature is not less than 159 degrees C., which is referred to as the upper limit value). The temperature data coding unit 100 receives the 8 bit data (referred to as "original data" here for convenience' sake) as its input, and determines the temperature range domain to which the present temperature belongs in the temperature range of some power of two. FIG. 3 shows an example that recognizes a temperature range of 32 degrees C. (=the 5th power of 2) as one domain.

On the assumption that the upper limit value is 159 degrees C., it is possible to determine which domain of the temperature range of the 5th power of 2 the present temperature belongs to by checking the higher-order 3 bits of the 8 bit input data (in FIG. 3, it is the higher-order 3 bits of {b7, b6, b5}). If the value of the 3 bits is one of {1, 0, 1}, {1, 1, 0} and {1, 1, 1}, since a decision that the temperature is not less than 159 degrees C. is made, the information that the present temperature is not less than the upper limit temperature (159 degrees C.) is retained temporarily (it is defined as the temperature range domain 0). If the temperature is less than that, the 3 bit data is considered to belong to one of the temperature range domains in descending order of temperature: {1, 0, 0} (temperature range domain 1: 159 degrees C. to 128 degrees C.), {0, 1, 1} (temperature range domain 2: 127 degrees C. to 96 degrees C.), {0, 1, 0} (temperature range domain 3: 95 degrees C. to 64 degrees C.), {0, 0, 1} (temperature range domain 4: 63 degrees C. to 32 degrees C.), and {0, 0, 0} (temperature range domain 5: 31 degrees C. to 0 degree C.) and the following variable-length pre-codes are assigned to the corresponding values.

| 3 bit value | pre-code | |
|---|---|---|
| {1, 0, 0} | {1} | temperature range domain 1 |
| {0, 1, 1} | {0, 1} | temperature range domain 2 |
| {0, 1, 0} | {0, 0, 1} | temperature range domain 3 |
| {0, 0, 1} | {0, 0, 0, 1} | temperature range domain 4 |
| {0, 0, 0} | {0, 0, 0, 0, 1} | temperature range domain 5 |

The pre-code represents that the temperature is in the temperature range domain 1 by {1}, and every time the temperature range of the temperature range domain drops, the number of {0} is added by one to the top of the data. In addition, together with the identification of the temperature range domain and the determination of the pre-code, as for the data values (5 bit value of {b4, b3, b2, b1, b0}) in the temperature range domain, every time the temperature domain drops, the data corresponding to the resolution of the lower-order bits of the data is reduced stepwise. More specifically, the significant data value of each temperature range domain is defined as follows.

| temperature range domain | bits | resolution |
|---|---|---|
| 1 | {b4, b3, b2, b1, b0} | 1 degree C. |
| 2 | {b4, b3, b2, b1} | 2 degrees C. |
| 3 | {b4, b3, b2} | 4 degrees C. |
| 4 | {b4, b3} | 8 degrees C. |
| 5 | {b4} | 16 degrees C. |

Then the foregoing pre-code is connected before the data to determine the final temperature coded value as 6 bit fixed length data as follows. At this time, when the foregoing information about the "temperature range domain 0" (not less than the upper limit temperature) is retained, the same temperature coded value as that of the highest temperature in the temperature range domain 1 (all bits are 1) is output as the value of the temperature range domain 0.

temperature range domain 0 {1, 1, 1, 1, 1, 1}
temperature range domain 1 {1, b4, b3, b2, b1, b0}
temperature range domain 2 {0, 1, b4, b3, b2, b1}
temperature range domain 3 {0, 0, 1, b4, b3, b2}
temperature range domain 4 {0, 0, 0, 1, b4, b3}
temperature range domain 5 {0, 0, 0, 0, 1, b4}

Figure 4:
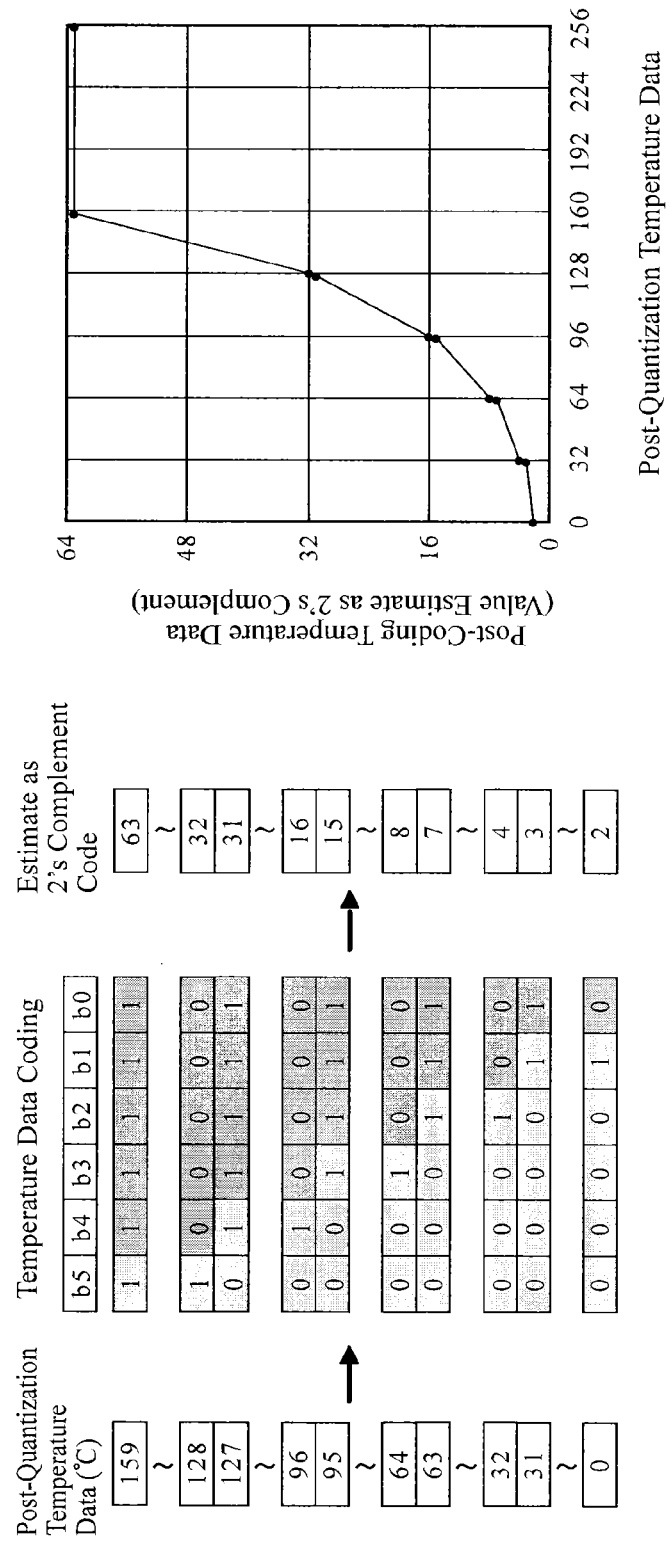
FIG. 4 is a diagram illustrating a monotone increase in the coding method of the semiconductor element temperature control system of the embodiment 1 in accordance with the present invention.

Incidentally, the coding, when seen as the numerical representation of "2's complement" used in a common computer system, that is, when seen as a decimal number of $1*2^5+b4*2^4+b3*2^3+b2*2^2+b1*2+b0$ in the temperature range domain 1, although it does not have a proportional relation with the original data (the foregoing original data), it is clear that it is a "monotone increase" with respect to the sequence of the original data (FIG. 4 illustrates the relationships).

The temperature data (post-coding temperature data 440) coded by the temperature data coding unit 100 is delivered to the temperature data transmitting unit 110 to carry out communication across the electrical insulating unit 180.

For the temperature data transmitting unit 110 to carry out communication with the temperature data receiving unit 120 across the electrical insulating unit 180, it is necessary to decide some protocol in advance. At this time, if the code length of the post-coding temperature data 440 is not fixed, it becomes necessary to provide another port for a data valid signal (generally called data VALID signal) in addition to the port for the data communication, for example, which offers a problem of increasing the cost and reducing the reliability due to the addition of the electrical insulating unit 180. In addition, for example, even if the data transmission is made using only a single port for the data communication, it becomes necessary to exchange a data transfer start signal and a data transfer stop signal with the received side, which offers a problem of increasing the cost and reducing the reliability because of a complicated communication mechanism (data transmission mechanism and data receiving mechanism). However, since the temperature coding the temperature data coding unit 100 makes is a fixed length coding, data transfer based on data transfer control using only a simple start bit and stop bits is possible, that is, data transfer using a so-called asynchronous communication system is possible, which enables reducing the cost and maintaining the reliability.

Figure 5:
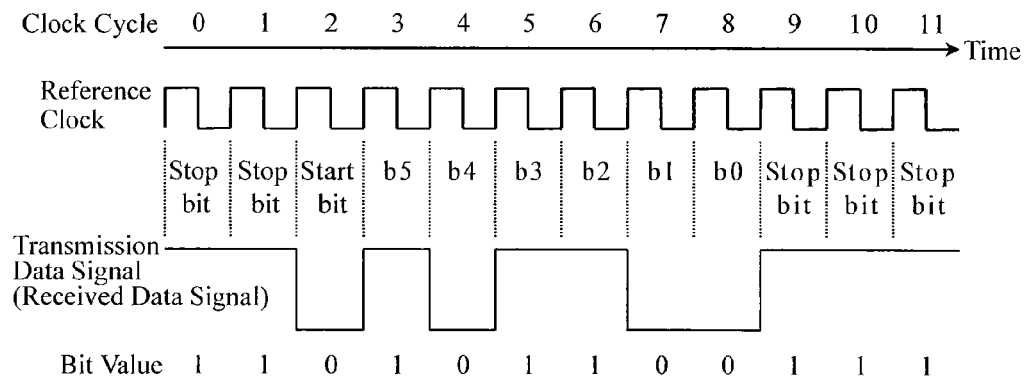
FIG. 5 is a diagram illustrating data transfer from the temperature data transmitting unit to the temperature data receiving unit of the semiconductor element temperature control system of the embodiment 1 in accordance with the present invention.

FIG. 5 shows an operation on a signal line when transferring the foregoing 6 bit data using the asynchronous communication system. Between the temperature data transmitting unit 110 and the temperature data receiving unit 120, a single communication port that passes the transmission data signal shown in FIG. 5 (received data signal seen from the temperature data receiving unit 120) enables the communication (although the reference clock signal in FIG. 5 is necessary in the temperature data transmitting unit 110 and in the temperature data receiving unit 120, it is not necessary to communicate the clock signal via the electrical insulating unit 180).

The temperature data received by the temperature data receiving unit 120 (post-coding temperature received data 510) is decoded by the temperature data reverse coding unit 130 as the same digital data as the post-coding temperature data 440. In other words, the post-coding temperature received data 510 received is identical with the post-coding temperature data 440.

As for the post-coding temperature received data 510 received, the temperature data reverse coding unit 130 converts it to the 2's complement representation, which is the common numerical code in a computer system, so that the control circuit 170 can execute various control processing based on the power device temperature. Since the conversion is the reverse conversion of the coding scheme in the temperature data coding unit 100 shown in FIG. 3, its details will be omitted. Incidentally, since the coding of the temperature data coding unit 100 deletes part of the original post-quantization information, the following restrictions occur.

There is no temperature values beyond 159 degrees C., and the maximum is 159 degrees C. (bit format is 10011111).

The lowest-order bits of the domains corresponding to the temperature range domains 2-5 are missing.

Accordingly, as for the missing lowest-order bits, reverse coding is made as follows.

"The bits in the missing (resolution reduced) portion are all placed at 1 (that is, placed at the maximum temperature value in the range of the resolution)".

The reverse coded temperature data 520 generated in this way has a value with an error due to variation of the temperature sensor as described before. Accordingly, carrying out a correcting calculation for the temperature sensor values, which is defined by a known method, will be able to increase the accuracy of the temperature sensor values. The temperature data correcting unit 150 is a section that executes the correcting processing. It executes the correcting calculation from the temperature correcting data 530 stored in the temperature data correcting data retaining unit 160, and supplies post-correction temperature data 540 which is the resultant temperature data values to the control circuit 170.

Figure 6:
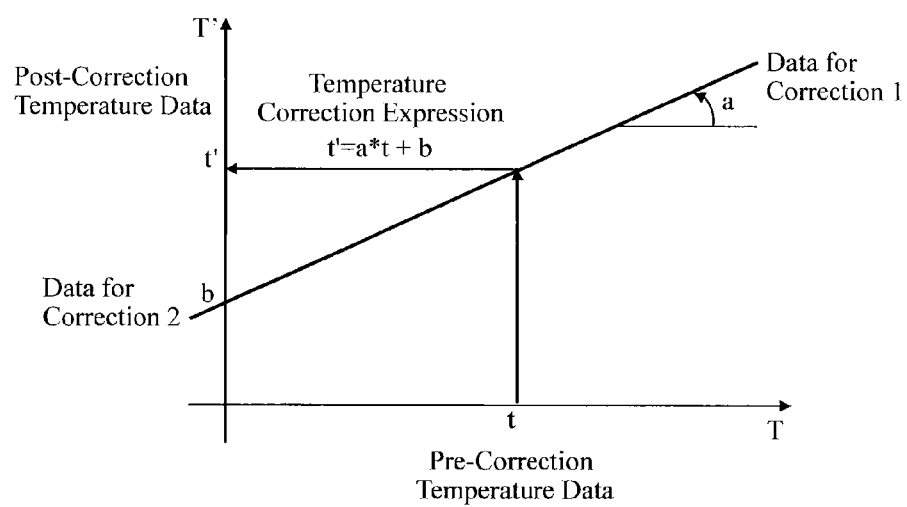
FIG. 6 is a diagram illustrating a correcting method in a temperature data correcting unit of the semiconductor element temperature control system of the embodiment 1 in accordance with the present invention.

Incidentally, correcting calculation of the temperature data correcting unit 150 is shown in FIG. 6. In a lot of temperature sensors, linear correction can implement high accuracy, and the calculation is shown in FIG. 6. More concretely, the post-correction temperature data t' can be calculated by $$t'=a*t+b$$

for the pre-correction temperature data t using the correcting data (correcting data 1=a, and correcting data 2=b) acquired from the correcting data retaining unit 160.

In this way, the post-correction temperature data 540 to be used by the control circuit 170 is derived. However, if the power device exceeds a particular temperature threshold, it is necessary to generate the overheat protection signal. As for the threshold comparison, the post-correction temperature data 540 will be able to make a more accurate decision by making the comparison by itself. In this case, however, since the threshold comparison calculation is carried out after the temperature data receiving unit 120 receives the temperature data and the temperature data reverse coding unit 130 performs the reverse coding, followed by the correcting calculation by the temperature data correcting unit 150, considerable time delay occurs. Since the overheat protection processing is for preventing the semiconductor element from a thermal breakdown or thermal runaway, and the semiconductor element operates in a state of easily suffering damages because of its temperature dependent characteristics, it is preferable to generate the overheat protection signal as soon as possible and to transfer it to the gate driving circuit 190 if the temperature is so high as exceeding the temperature threshold. The temperature data threshold comparator 140 implements it. The function of the temperature data threshold comparator 140 will be described below.

Figure 7:
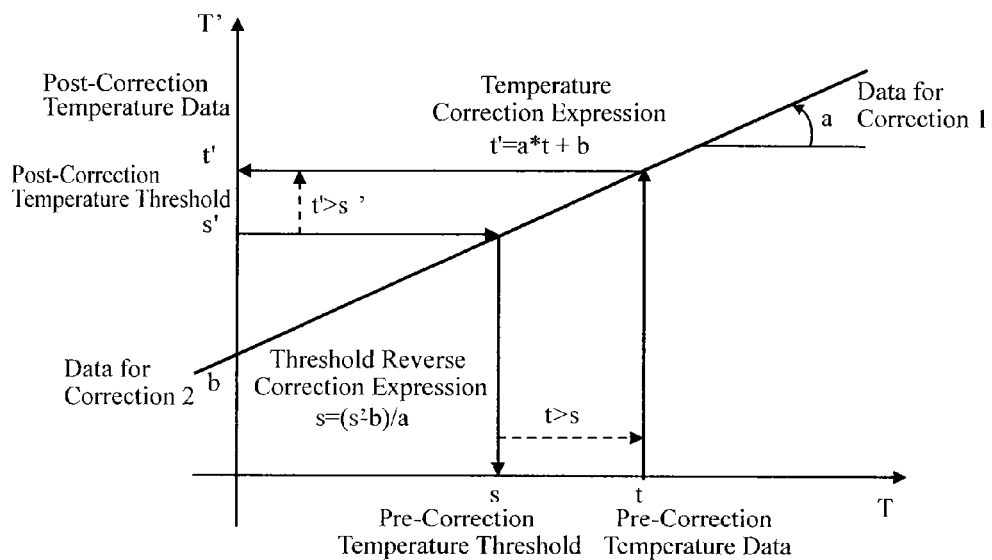
FIG. 7 is a diagram illustrating a deriving method of a pre-correction threshold in a temperature data threshold comparator of the semiconductor element temperature control system of the embodiment 1 in accordance with the present invention.

The correcting calculation as shown in FIG. 6 enables the post-correction temperature threshold s' in the post-correction temperature data to be easily converted to the pre-correction temperature threshold s in the pre-correction temperature data. FIG. 7 shows a concrete example of the conversion.

As shown in FIG. 7, the following calculation enables the conversion to the pre-correction temperature threshold s.

$$s=(s'-b)/a$$

In addition, as is clearly seen from FIG. 7, since the temperature correcting calculation is a linear conversion, the estimation (comparison) result as to whether the post-correction temperature data t' exceeds the post-correction temperature threshold s' is the same as the estimation (comparison) result as to whether the pre-correction temperature data t exceeds the pre-correction temperature threshold s. Thus, the value s can be derived in advance from the values s', a and b, and hence the highly accurate temperature threshold comparison can be made without executing the processing of the temperature data correcting unit 150.

Figure 8:
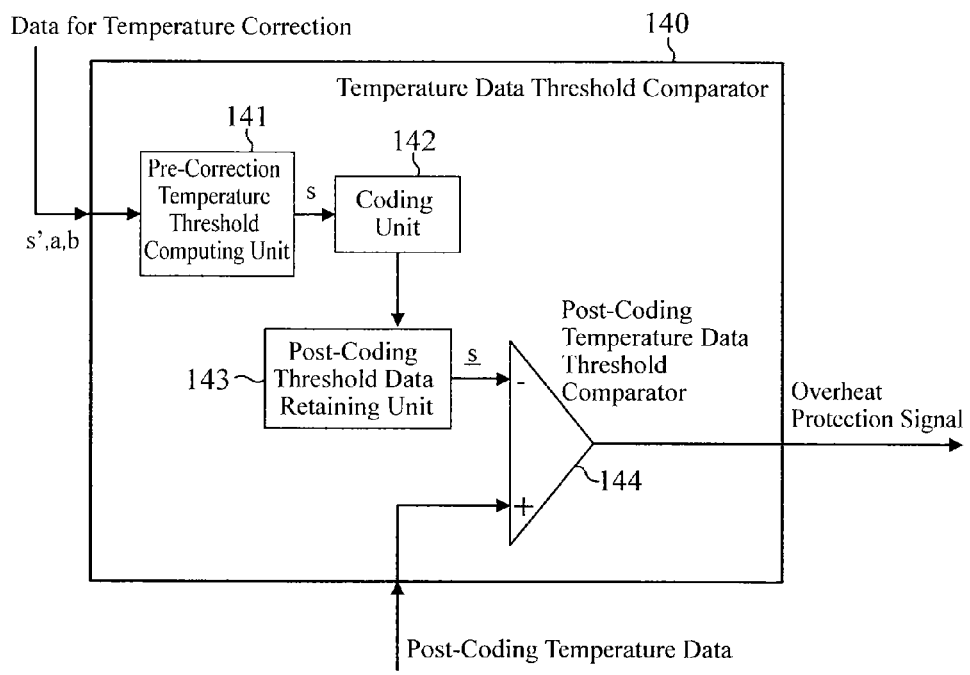
FIG. 8 is a block diagram showing a configuration for threshold comparison in the temperature data threshold comparator of the semiconductor element temperature control system of the embodiment 1 in accordance with the present invention.

In addition, as described above, since the coding the temperature data coding unit 100 carries out is the coding that has a "monotone increase" relation with the original data, the estimation result of the comparison is consistent with the comparison result before and after the coding. Accordingly, it is convenient to carry out the same coding of the pre-correction temperature threshold s as the coding performed by the temperature data coding unit 100 (see FIG. 3), and to compare the post-coding pre-correction threshold s̲ with the post-coding temperature received data 510 while considering them as 2's complement numerical codes used in a common computer system. FIG. 8 illustrates it.

FIG. 8 shows an internal configuration of the temperature data threshold comparator 140. As shown in FIG. 8, the temperature data threshold comparator 140 comprises a pre-correction temperature threshold computing unit 141, a coding unit 142, a post-coding threshold data retaining unit 143, and a post-coding temperature data threshold comparator 144. Here, the pre-correction temperature threshold computing unit 141 is an arithmetic unit that calculates the pre-correction temperature threshold s by using the foregoing calculation s=(s'−b)/a. The coding unit 142 is an arithmetic unit that carries out the same coding as the coding of the temperature data coding unit 100 for the pre-correction temperature threshold s, and generates the post-coding pre-correction threshold s̲. The post-coding threshold data retaining unit 143 is a storage that retains the post-coding pre-correction threshold s̲. In addition, the post-coding temperature data threshold comparator 144 is a comparator that compares the post-coding pre-correction threshold s with the post-coding temperature received data 510, and asserts the overheat protection instruction signal 340 if the post-coding temperature received data 510 is greater.

As shown in FIG. 8, as for the post-coding pre-correction threshold s, it is not necessary for the comparison calculation to calculate it each time, but to calculate and retain it beforehand (the post-coding threshold data retaining unit 143 maintains it). In addition, since the comparison calculation can be carried out in terms of the 2's complement numerical code, a calculation circuit for the comparison used in a common computer system can be used. It can be optimized as a circuit mounted, and a circuit that undergoes enough malfunctioning handling can be used. Accordingly, it can maintain high-speed and high reliability.

As described above, according to the semiconductor element temperature detecting system of the embodiment 1, it comprise the digital temperature data measuring unit that detects the temperature of the semiconductor element as the digital temperature data, and the temperature data coding unit that codes the digital temperature data to the prescribed length coded data which has the lower data resolution in the lower temperature range domain than in the higher temperature range domain, and which increases with an increase in the digital temperature data when estimated as the 2's complement numbers. Accordingly, it can increase the temperature data resolution at the high temperature which requires special processing based on the temperature data values while maintaining the wide detection range of the temperature data. In addition, since the temperature data is the fixed length data, the mechanism required for the temperature data communication becomes simple, and since the data bit length is compressed, high-speed temperature data communication becomes possible. In addition, when carrying out the designated calculation of the coded temperature data, since it can carry it out without converting the values through the processing of converting to the numerical code (2's complement) a common computer handles, it can speed up the processing of the temperature data.

In addition, according to the semiconductor element temperature detecting system of the embodiment 1, the coded data consists of the combination of the pre-code and the data code, in which the combination is determined so as to cover the data range including the predetermined lowest limit value of the temperature detection, the pre-code is arranged by setting the upper limit value of detection in the high temperature range as the reference value, by setting the temperature range domain for each range of some power of two using the minimum detection resolution as a basic unit from the upper limit value of the detection, and by placing bits of 0 before a bit of 1 for each temperature range domain beginning from the high temperature range while increasing the number of bits of 0 with the number of the temperature range domain, and the data code is formed by halving the detection resolution by deleting the lower-order bits of the temperature data by one bit for each temperature range domain beginning from the high temperature range. Accordingly, it can implement the fixed length code value concretely, and reduce the cost and maintain the high reliability.

In addition, according to the semiconductor element temperature detecting system of the embodiment 1, it comprises the temperature data threshold comparator that compares the temperature data coded by the temperature data coding unit with the post-coding threshold obtained by coding the predetermined temperature threshold, thereby obtaining the comparison result of the temperature data and the threshold. Accordingly, it can carry out high-speed threshold comparison of the highly accurate temperature data.

In addition, according to the semiconductor element temperature detecting system of the embodiment 1, it employs the asynchronous system as the communication system between the temperature data coding unit that generates the coded data and the temperature data receiving unit that receives it. Accordingly, it can reduce the number of insulating materials when carrying out communication across the insulating materials, thereby being able to reduce the cost.

In addition, according to the semiconductor element temperature control system of the embodiment 1, it comprises the driving circuit that carries out driving control for the overheat protection of the semiconductor element in accordance with the comparison result the semiconductor element temperature detecting system detects. Accordingly, when correcting the characteristic variation of the analog temperature sensor contained in the temperature data and when comparing the corrected value with the temperature threshold required for the overheat protection, it can obviate the necessity for the correcting processing of the temperature data detected, and hence can generate highly responsive overheat protection signal. In addition, according to the semiconductor element temperature control system of the embodiment 1, it is configured in such a manner as to carry out the temperature control of the semiconductor element using the coded data the semiconductor element temperature detecting system detects. Accordingly, when altering the control contents using the temperature data acquired, it can handle the data directly by the control apparatus implemented as a common computer system.

Figure 9:
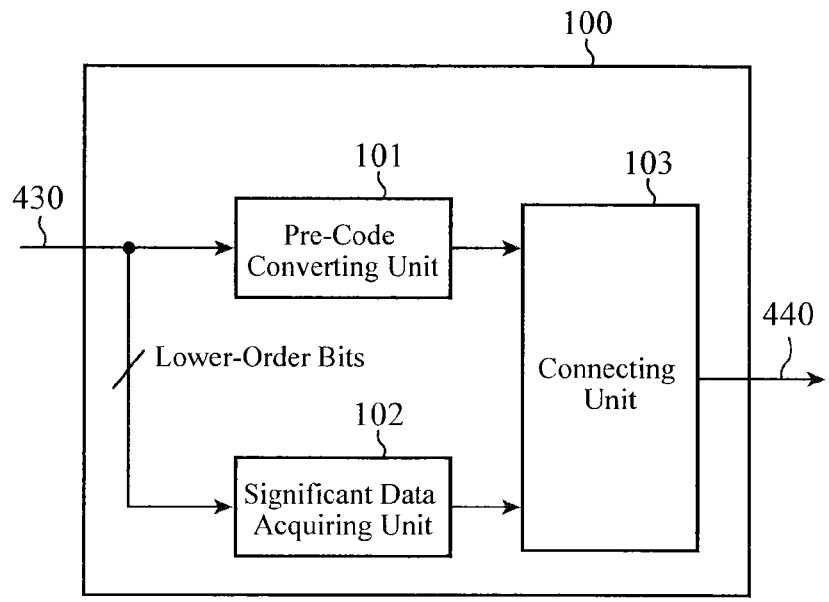
FIG. 9 is a schematic diagram showing a configuration of a coding unit of the semiconductor element temperature control system of the embodiment 1 in accordance with the present invention.

For example, although the present embodiment shows an example in which the temperature data coding unit 100 codes the 8 bit post-quantization temperature data 430 quantized by the temperature data quantizing unit 200, and the temperature data transmitting unit 110 sends the post-coding temperature data 440 to the low voltage section electrically insulated from the power device section, this is not essential. For example, as shown in FIG. 9, the temperature data coding unit 100 can be configured in such a manner as to comprise a pre-code converting unit 101, a significant data acquiring unit 102, and a connecting unit 103. The operation of FIG. 9 will be described below. The post-quantization temperature data 430 with A bits quantized by the temperature data quantizing unit 200 is supplied to the pre-code converting unit 101. The pre-code converting unit 101 converts the higher-order B bits of the A bits to the pre-code by the method shown in FIG. 3.

More specifically, the pre-code converting unit 101 generates the pre-code consisting of (N−1) bits of 0 followed by one bit of 1 for the N-th (N is a positive integer) highest temperature range domain with respect to the prescribed temperature range domain (FIG. 3).

On the other hand, the lower-order (A-B) bits of the A bit of the post-quantization temperature data 430 is supplied to the significant data acquiring unit 102. The significant data acquiring unit 102 reduces the resolution of the lower-order (A-B) bits stepwise, and stores in the significant data acquiring unit 102. More specifically, as for the N-th highest temperature range domain with respect to the prescribed temperature range domain, the significant data acquiring unit 102 acquires the significant data that has the lowest-order N−1 bits deleted and be flush on the right (FIG. 3).

Furthermore, the connecting unit 103 combines the pre-code passing through the conversion by the pre-code converting unit 101 with the significant data obtained by the significant data acquiring unit 102 to form the fixed length post-coding temperature data 440. The post-coding temperature data 440 thus coded by the temperature data coding unit 100 is sent to the temperature data transmitting unit 110 to be transmitted.

Thus, the semiconductor element temperature detecting system in accordance with the present invention can be configured by comprising the digital temperature data measuring unit 220 that detects the temperature of the semiconductor element as the digital temperature data; and the temperature data coding unit 100 including the pre-code converting unit 101 that defines the plurality of temperature range domains from the prescribed lower-order bits of the digital temperature data and generates the pre-code from the higher-order bits other than the prescribed lower-order bits, the significant data acquiring unit 102 that obtains the significant data corresponding to the temperature range domain from the prescribed lower-order bits of the digital temperature data, and the connecting unit 103 that generates the coded data by combining the pre-code with the significant data.

As a semiconductor module, it can be implemented by comprising the power semiconductor element 230; the digital temperature data measuring unit 220 that detects the temperature of the semiconductor element as the digital temperature data; and the temperature data coding unit 100 including the pre-code converting unit 101 that defines the plurality of temperature range domains from the prescribed lower-order bits of the digital temperature data and generates the pre-code from the higher-order bits other than the prescribed lower-order bits, the significant data acquiring unit 102 that obtains the significant data corresponding to the temperature range domain from the prescribed lower-order bits of the digital temperature data, and the connecting unit 103 that generates the coded data by combining the pre-code with the significant data.

Embodiment 2

Figure 10:
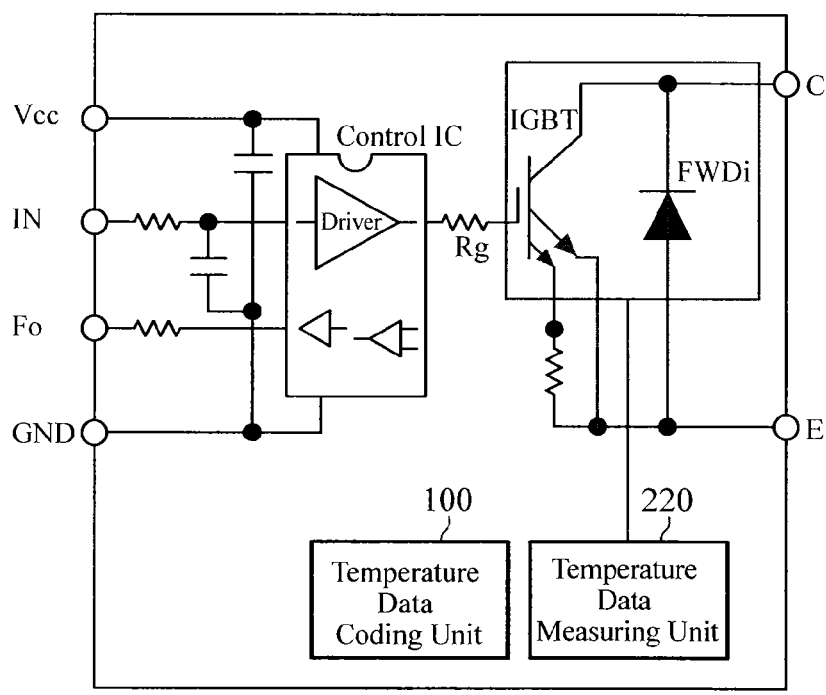
FIG. 10 is a schematic diagram showing a configuration of a semiconductor module of an embodiment 2 in accordance with the present invention.

FIG. 10 is a schematic diagram showing a configuration of a semiconductor module of an embodiment 2, which comprises in particular an IGBT (Insulated Gate Bipolar Transistor), an FWDi (freewheel diode), a control IC for operating the IGBT, the temperature measuring unit 220, the temperature data coding unit 100, and an interface having Vcc, GND, IN, Fo, C and E for connecting them to a load (motor or the like) or board, or to a controller driven by the semiconductor module. Here, Vcc designates a power supply, GND designates a ground, IN designates an input for driving the gate signal of the IGBT, and Fo designates an error to be supplied to the controller side if an error occurs. In addition, C designates the collector of the IGBT, and E designates the emitter side of the IGBT which is connected to the load side to be driven.

The temperature data measuring unit 220 detects the temperature of the semiconductor element as the digital temperature data in the same manner as its counterpart of the embodiment 1. The temperature data coding unit 100 codes the digital temperature data to the prescribed length coded data that increases with an increase of the digital temperature data in the same manner as its counterpart of the embodiment 1, when the data resolution in the lower temperature range domains is lower than that in the higher temperature range domains, and when the digital temperature data is estimated in terms of the 2's complement number.

The semiconductor module can transmit the temperature data at a high-speed when operating the IGBT in response to the information from the interface, thereby being able to reduce the cost and maintain the high reliability.

Embodiment 3

Figure 11:
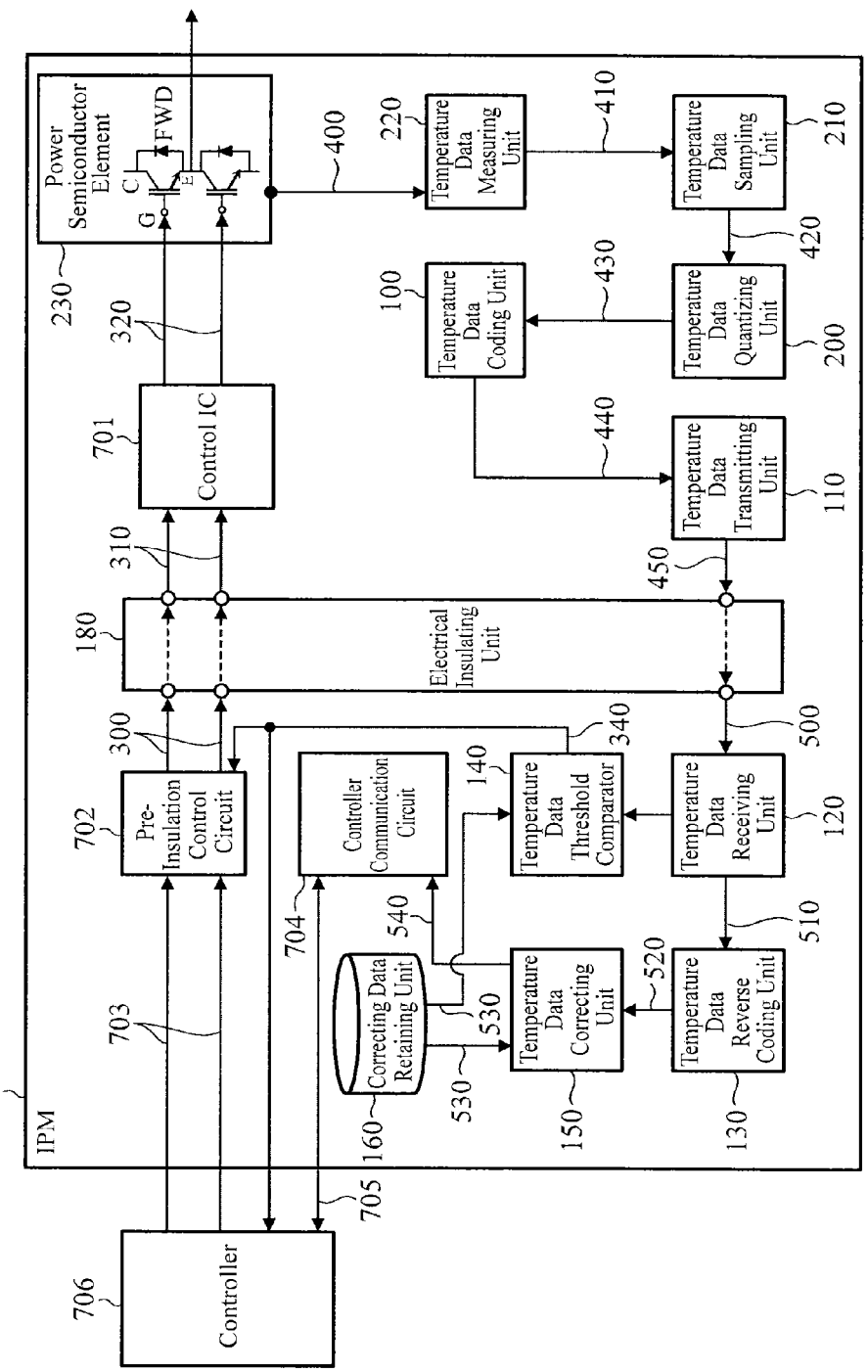
FIG. 11 is a schematic diagram showing a configuration of a semiconductor module and semiconductor module system of an embodiment 3 in accordance with the present invention.

FIG. 11 is a schematic diagram showing a configuration of a semiconductor module and a semiconductor module system of an embodiment 3. In FIG. 11, the reference symbol IPM designates a semiconductor module (intelligent power module), and the IPM 700 comprises the temperature data coding unit 100, temperature data transmitting unit 110, temperature data receiving unit 120, temperature data reverse coding unit 130, temperature data threshold comparator 140, temperature data correcting unit 150, correcting data retaining unit 160, electrical insulating unit 180, temperature data quantizing unit 200, temperature data sampling unit 210, temperature data measuring unit 220, power semiconductor element 230, a control IC 701, a pre-insulation control circuit 702, and a controller communication circuit 704. More specifically, the IPM 700 of the present embodiment comprises the pre-insulation control circuit 702 instead of the control circuit 170 in the embodiment 1, disposes the control IC 701 instead of the gate driving circuit 190, and incorporates the controller communication circuit 704.

Here, since the configuration other than the control IC 701, pre-insulation control circuit 702, and controller communication circuit 704 is the same as that of the embodiment 1 shown in FIG. 1, the description thereof will be omitted.

The control IC 701 receives the power device gate control signal 310 as its input, and generates the power device gate driving signal 320. The control IC 701 does not have the overheat protection function the gate driving circuit 190 has, which is described with reference to FIG. 2 of the embodiment 1 (the function of acquiring the overheat protection control signal 330 as the input and inverting the signal, of carrying out AND operations of the upper side control signal and the underside control signal, and as a result, of breaking (making Low (0)) the power device gate driving signal 320 if the overheat protection control signal 330 is High (1)). Instead, it has a function of adjusting the voltage level of the power device gate control signal 310 (5 V, for example) and the voltage level of the power device gate driving signal 320 (15 V, for example), and of delivering the upper side control signal and underside control signal passing through the voltage level adjustment directly as the power device gate driving signal 320 (thus, this is the same as that the overheat protection control signal 330 is always L(0) in the description of FIG. 2).

In the same manner as in the embodiment 1, the power device gate control signal 310 transfers the power device gate instruction signal 300 across the electrical insulating unit 180. In addition, the power device gate instruction signal 300 is output from the pre-insulation control circuit 702 rather than from the control circuit 170 of the embodiment 1.

Receiving the controller gate instruction signal 703 which is the control signal from the controller 706 in a system using the IPM 700 and the overheat protection instruction signal 340 from the temperature data threshold comparator 140, the pre-insulation control circuit 702 generates the power device gate instruction signal 300 as the driving control signal of the power semiconductor element 230 by the function similar to that of the gate driving circuit 190 shown in FIG. 2 (it corresponds to a functional configuration in which the power device gate control signal 310 in FIG. 2 becomes the controller gate instruction signal 703, and the power device gate driving signal 320 becomes the power device gate instruction signal 300). In addition, the controller 706, which is a controller that controls the IPM 700, comprises a microcomputer or an ASIC.

In addition, the present embodiment has a function of sending the overheat protection instruction signal 340 the temperature data threshold comparator 140 generates to the controller 706 as the temperature protection executing state information of the power semiconductor element 230.

More specifically, it is configured in such a manner that if a condition of carrying out the overheat protection occurs as a result of the comparison decision in the temperature data threshold comparator 140, the pre-insulation control circuit 702 disables the controller gate instruction signal 703 from the controller 706 in response to the overheat protection instruction signal 340, informs the power device gate instruction signal 300 of that, and sends the information that the disabled state has occurred to the controller 706 directly using the overheat protection instruction signal 340.

In addition, the present embodiment comprises the controller communication circuit 704. The controller communication circuit 704 retains therein the post-correction temperature data 540 the temperature data correcting unit 150 generates, and enables the controller 706 to acquire the values of the post-correction temperature data 540 as the temperature data of the power semiconductor element 230 in response to a temperature data read request from the controller communication signal 705.

As the controller communication signal 705, it is conceivable to employ, for example, I2C (Inter-Integrated Circuit: the serial bus standard developed by Philips') and SPI (Serial Peripheral Interface: the serial bus standard developed by Motorola, Inc.), which are communication specifications generally used between a micro controller (an IC, the so-called microcomputer) and another IC.

In the IPM 700 implemented by the present embodiment, the electrical insulating unit 180 enables connecting the power supply domain (high voltage domain) which includes the power semiconductor element 230 and control IC 701 with the power supply domain (low voltage domain) which includes the pre-insulation control circuit 702 and controller communication circuit 704 with respect to information, but insulating them electrically.

Generally, the power semiconductor element 230 is operated by the power supply of several hundred volts and the control IC 701 is operated by the power supply of several tens of volts, and the controller 706 that supplies the IPM 700 with the controller gate instruction signal 703 is operated by the power supply of 3.3 V or 5 V.

Since the configuration can prevent electrical noise generally produced in the high voltage domain from spreading to the low voltage domain, it can operate the pre-insulation control circuit 702 and controller communication circuit 704 by the same power supply as the controller 706, thereby being able to simplify the design work for noise control measures which is troublesome work in the development of a board on which the controller 706 and IPM 700 are mounted, and to easily acquire the temperature information and the information about the temperature protection state of the power semiconductor element 230 the IPM 700 retains.

Incidentally, as for the temperature data quantizing unit 200, temperature data sampling unit 210, temperature data coding unit 100, temperature data transmitting unit 110, temperature data receiving unit 120, temperature data reverse coding unit 130, temperature data threshold comparator 140, temperature data correcting unit 150, correcting data retaining unit 160, pre-insulation control circuit 702, and controller communication circuit 704, although it is conceivable to implement them in various fashions such as using discrete components, dedicated ASICs (Application Specific Integrated Circuits), FPGAs (Field-Programmable Gate Arrays), microcomputers or DSPs (Digital Signal Processor), the implementation fashion is not limited to a particular one.

In addition, as for the implementation of the temperature data coding unit 100, although the embodiment 1 shows an example of reducing the 8 bit data to 6 bit data, the data can be reduced to 7 bit or 5 bit data (any bits will do as long as the number of bits is lower).

In addition, although the controller communication signal 705 used for the data communication between the controller communication circuit 704 and the controller 706 is described based on the serial bus specifications such as I2C and SPI, other serial bus specifications and parallel bus specifications can be used without any problems.

As described above, according to the semiconductor module of the embodiment 3, it comprises the control circuit that outputs the driving control signal of the semiconductor element in accordance with the comparison result of the temperature data threshold comparator and the control signal from the controller for controlling the system, and the communication circuit that supplies the controller with the coded data detected by the semiconductor element temperature detecting system of the embodiment 1 as the temperature data of the semiconductor element, in which the temperature data threshold comparator supplies its comparison result to the controller as the temperature protection executing state information of the semiconductor element. Accordingly, it can provide the controller with the interface for controlling the temperature control system.

Furthermore, a semiconductor module system can be implemented by incorporating the controller 706 in the IPM 700 of the present embodiment. When causing the controller 706 to carry out complicated instructions, the temperature of the IGBT rises with respect to the instruction signal from the controller 706. Thus, if the IPM 700 stops the IGBT by deciding the validity of the instructions from the controller 706 by comparing the temperature data with a predetermined temperature data threshold, and provides the controller 706 with the present temperature data, the controller 706 can implement the complicated control in accordance with the temperature data.

Thus, the semiconductor module system shown in FIG. 11 comprises the power semiconductor element 230; the controller 706 that outputs the instruction signal for controlling the gate of the power semiconductor element 230; the pre-insulation control circuit 702 that generates the control signal which is the instruction signal by deciding the validity of the instruction signal from the controller 706 as a result of comparing the temperature data with the temperature data threshold or the like; the control IC 701 which is the driving signal generating unit that generates the driving signal for driving the gate of the power semiconductor element 230 in response to the control signal; the digital temperature data measuring unit 220 that detects the temperature of the power semiconductor element 230 as the digital temperature data; and the temperature data coding unit 100 including the pre-code converting unit 101 that determines the plurality of temperature range domains from the prescribed lower-order bits of the digital temperature data and generates the pre-code from the higher-order bits other than the prescribed lower-order bits, the significant data acquiring unit 102 that obtains the significant data corresponding to the temperature range domain from the prescribed lower-order bits of the digital temperature data, and the connecting unit 103 that generates the coded data by combining the pre-code with the significant data.

In particular, as for the pre-insulation control circuit 702 that decides the validity of the instruction signal from the controller 706 from the comparison result of the temperate data with the temperature data threshold or the like and generates the control signal which is the instruction signal, and the control IC 701 which is the driving signal generating unit that generates the driving signal for driving the gate of the power semiconductor element 230 in response to the control signal, it is enough that they comprise the control unit 702 that generates the instruction signal by deciding the validity of the instruction signal of the controller 706 in accordance with the temperature data of the semiconductor element, and the driving signal generating unit that generates the driving signal for driving the gate of the power semiconductor element 230 in response to the control signal.

According to the semiconductor module system, it can quickly stop the control signal for controlling the IGBT in response to the temperature data detected about the IGBT in the high temperature operation, and the controller 706 can cause the semiconductor module to carry out complicated instructions in accordance with the temperature data by providing the controller 706 with the present temperature data of the IGBT.

Furthermore, it becomes possible to implement the semiconductor module system capable of detecting the temperature even if the instruction signal of the controller is complicated and capable of immediately carrying out the driving instruction control from the temperature detection by comprising the power semiconductor element 230; the controller that outputs the instruction signal for controlling the gate of the semiconductor element; the driving signal generating unit that generates the driving signal of the power semiconductor element 230 from the instruction signal; the digital temperature data measuring unit 220 that detects the temperature of the power semiconductor element 230 as the digital temperature data; and the temperature data coding unit 100 including the pre-code converting unit 101 that determines the plurality of temperature range domains from the prescribed lower-order bits of the digital temperature data and generates the pre-code from the higher-order bits other than the prescribed lower-order bits, the significant data acquiring unit 102 that obtains the significant data corresponding to the temperature range domain from the prescribed lower-order bits of the digital temperature data, and the connecting unit 103 that generates the coded data by combining the pre-code with the significant data.

Incidentally, it is to be understood that a free combination of the individual embodiments, variations of any components of the individual embodiments or removal of any components of the individual embodiments are possible within the scope of the present invention.

Industrial Applicability

As described above, a semiconductor element temperature detecting system and a semiconductor module and a semiconductor module system in accordance with the present invention are configured in such a manner that they employ the coded data of the temperature data of the semiconductor element with different data resolution in the high temperature range and the low temperature range, and that the temperature data has a fixed data length. Accordingly, they are suitably applied to a system that carries out the temperature detection and temperature control of a power device (power semiconductor element).

Description Of Reference Symbols 100 temperature data coding unit; 101 pre-code converting unit; 102 significant data acquiring unit; 103 connecting unit; 110 temperature data transmitting unit; 120 temperature data receiving unit; 130 temperature data reverse coding unit; 140 temperature data threshold comparator; 150 temperature data correcting unit; 160 correcting data retaining unit; 170 control circuit; 180 electrical insulating unit; 190 gate driving circuit; 200 temperature data quantizing unit; 210 temperature data sampling unit; 220 temperature data measuring unit; 230 power semiconductor element; 300 power device gate instruction signal; 310 power device gate control signal; 320 power device gate driving signal; 330 overheat protection control signal; 340 overheat protection instruction signal; 400 power device production heat; 410 power device temperature detection data; 420 post-sampling temperature data; 430 post-quantization temperature data; 440 post-coding temperature data; 450 post-coding temperature transmission data; 500 insulating unit passed temperature data; 510 post-coding temperature received data; 520 reverse coded temperature data; 530 temperature correcting data; 540 post-correction temperature data; 700 IPM (intelligent power module); 701 control IC; 702 pre-insulation control circuit; 703 controller gate instruction signal; 704 controller communication circuit; 705 controller communication signal; 706 controller.

What is claimed is:

1. A semiconductor element temperature detecting system comprising:
    a digital temperature data measuring unit that detects temperature of a semiconductor element as digital temperature data; and
    a temperature data coding unit that codes the digital temperature data to coded data with a common prescribed length, which coded data of the common prescribed length in a low temperature range domain has lower data resolution than coded data of the common prescribed length in a high temperature range domain, and increases with an increase of the digital temperature data when estimating the digital temperature data as 2's complement numbers.

2. A semiconductor element temperature detecting system comprising:
    a digital temperature data measuring unit that detects temperature of a semiconductor element as digital temperature data; and
    a temperature data coding unit including:
        a pre-code converting unit that determines a plurality of temperature range domains in accordance with prescribed lower-order bits of the digital temperature data, and generates a pre-code from higher-order bits of the digital temperature data other than the prescribed lower-order bits;
        a significant data acquiring unit that obtains significant data corresponding to the temperature range domain from the prescribed lower-order bits of the digital temperature data; and
        a connecting unit that generates coded data by combining the pre-code with the significant data.

3. he semiconductor element temperature detecting system according to claim 2, wherein
    the pre-code converting unit generates the pre-code consisting of N−1 bits of 0 followed by one bit of 1 for an N-th highest temperature range domain (N is a positive integer) with respect to a prescribed temperature range domain used as a reference.

4. The semiconductor element temperature detecting system according to claim 2, wherein
    the significant data acquiring unit obtains the significant data by deleting lowest-order N−1 bits for the N-th highest temperature range domain (N is a positive integer) with respect to a prescribed temperature range domain used as a reference.

5. The semiconductor element temperature detecting system according to claim 1, wherein
    the coded data comprises a combination of a pre-code and a data code, wherein the combination is determined so as to cover a data range including a predetermined lowest limit value of the temperature detection, the pre-code is arranged by setting an upper limit value of detection of the high temperature range as a reference value, by setting a temperature range domain for each range of some power of two using minimum detection resolution as a basic unit from the upper limit value of the detection, and by placing bits of 0 before a bit of 1 for each temperature range domain beginning from the high temperature range while increasing the number of bits of 0 with a number of the temperature range domain, and the data code is formed by halving the detection resolution by deleting lower-order bits of the temperature data by one bit for each temperature range domain beginning from the high temperature range.

6. The semiconductor element temperature detecting system according to claim 1, further comprising:
   a temperature data threshold comparator that compares the temperature data coded by the temperature data coding unit with a post-coding threshold obtained by coding a predetermined temperature threshold, and that obtains a comparison result of the temperature data with the threshold.

7. The semiconductor element temperature detecting system according to claim 1, wherein
   the temperature data coding unit employs asynchronous transmission as a communication method with a temperature data receiving unit that receives the coded data generated by the temperature data coding unit.

8. The semiconductor element temperature detecting system according to claim 1, wherein all coded data in a temperature range of the low temperature range domain has the same data resolution.

9. The semiconductor element temperature detecting system according to claim 8, wherein all coded data in a temperature range of the high temperature range domain has the same data resolution.

10. A semiconductor module comprising:
   a semiconductor element;
   a digital temperature data measuring unit that detects temperature of the semiconductor element as digital temperature data; and
   a temperature data coding unit including:
      a pre-code converting unit that determines a plurality of temperature range domains in accordance with prescribed lower-order bits of the digital temperature data, and generates a pre-code from higher-order bits of the digital temperature data other than the prescribed lower-order bits;
      a significant data acquiring unit that obtains significant data corresponding to the temperature range domain from the prescribed lower-order bits of the digital temperature data; and
      a connecting unit that generates coded data by combining the pre-code with the significant data.

11. A semiconductor module system comprising:
   a semiconductor element;
   a controller that outputs an instruction signal for controlling a gate of the semiconductor element;
   a digital temperature data measuring unit that detects temperature of the semiconductor element as digital temperature data;
   a temperature data coding unit including:
      a pre-code converting unit that determines a plurality of temperature range domains in accordance with prescribed lower-order bits of the digital temperature data, and generates a pre-code from higher-order bits of the digital temperature data other than the prescribed lower-order bits;
      a significant data acquiring unit that obtains significant data corresponding to the temperature range domain from the prescribed lower-order bits of the digital temperature data; and
      a connecting unit that generates coded data by combining the pre-code with the significant data;
   a control unit that decides validity of the instruction signal of the controller in accordance with the digital temperature data and generates a control signal; and
   a driving signal generating unit that generates a driving signal for driving the gate of the semiconductor element in response to the control signal.

* * * * *